United States Patent
Yoshimura et al.

(10) Patent No.: US 8,227,296 B2
(45) Date of Patent: Jul. 24, 2012

(54) STACKED SEMICONDUCTOR DEVICE

(75) Inventors: Atsushi Yoshimura, Yokosuka (JP);
Hideko Mukaida, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/067,839

(22) Filed: Jun. 29, 2011

(65) Prior Publication Data
US 2011/0263076 A1    Oct. 27, 2011

Related U.S. Application Data

(62) Division of application No. 11/724,303, filed on Mar. 15, 2007, now Pat. No. 7,994,620.

(30) Foreign Application Priority Data

Mar. 16, 2006 (JP) ................................ P2006-073142

(51) Int. Cl.
*H01L 21/00* (2006.01)

(52) U.S. Cl. ............... 438/109; 257/686; 257/E21.614; 257/E25.006; 257/E25.013; 257/E25.027

(58) Field of Classification Search ................... 438/109; 257/686, E21.614, E25.013, E25.027
See application file for complete search history.

(56) References Cited

U.S. PATENT DOCUMENTS

| | | | |
|---|---|---|---|
| 6,157,080 A | 12/2000 | Tamaki et al. | |
| 6,545,365 B2 | 4/2003 | Kondo et al. | |
| 6,657,290 B2 | 12/2003 | Fukui et al. | |
| 6,833,287 B1 | 12/2004 | Hur et al. | |
| 2005/0107497 A1* | 5/2005 | Akaho et al. | 523/457 |
| 2005/0205981 A1* | 9/2005 | Yoshimura et al. | 257/686 |
| 2006/0044735 A1* | 3/2006 | Hayashi et al. | 361/313 |
| 2006/0139893 A1 | 6/2006 | Yoshimura et al. | |
| 2006/0226520 A1 | 10/2006 | Yoshimura et al. | |

FOREIGN PATENT DOCUMENTS

| | | |
|---|---|---|
| JP | 2001-308262 | 11/2001 |
| JP | 2002-222913 | 8/2002 |
| JP | 2003-218316 | 7/2003 |
| JP | 2003-258034 | 9/2003 |
| JP | 2004-072009 | 3/2004 |

(Continued)

OTHER PUBLICATIONS

Fukui, Y. et al., "Semiconductor Device and Manufacture the Same," Patent Abstract of Taiwanese Patent No. TW544902B, Aug. 1, 2003, 1 page.
Office Action issued by the Korean Patent Office on Feb. 26, 2008, for Korean Patent Application No. 10-2007-25370, and English-language Summary thereof. Notice of Reasons for Rejection issued by the Japanese Patent Office on Jul. 27, 2010, for Japanese Patent Application No. 2006-073142, and English-language translation thereof.

*Primary Examiner* — A. Sefer
*Assistant Examiner* — Farid Khan
(74) *Attorney, Agent, or Firm* — Finnegan, Henderson, Farabow, Garrett & Dunner, L.L.P.

(57) ABSTRACT

A stacked semiconductor device includes a first semiconductor element bonded on a circuit base. The first semiconductor element is electrically connected to a connection part of the circuit base via a first bonding wire. A second semiconductor element is bonded on the first semiconductor element via a second adhesive layer with a thickness of 50 μm or more. The second adhesive layer is formed of an insulating resin layer whose glass transition temperature is 135° C. or higher and whose coefficient of linear expansion at a temperature equal to or lower than the glass transition temperature is 100 ppm or less.

18 Claims, 3 Drawing Sheets

FOREIGN PATENT DOCUMENTS

| | | | |
|---|---|---|---|
| JP | 2006-5333 | | 1/2006 |
| JP | 2006-005333 | * | 1/2006 |
| KR | 10-2004-0091013 | | 10/2004 |
| KR | 10-0461220 | | 12/2004 |
| WO | WO 02/075809 | | 9/2002 |
| WO | WO 2006/109506 A1 | | 10/2006 |

* cited by examiner

STACKED SEMICONDUCTOR DEVICE

CROSS-REFERENCE TO RELATED APPLICATIONS

This is a division of Application Ser. No. 11/724,303, filed Mar. 15, 2007 now U.S. Pat. No. 7,994,620, which is incorporated herein by reference.

This application is based upon and claims the benefit of priority from the prior Japanese Patent Application No. 2006-073142, filed on Mar. 16, 2006; the entire contents of which are incorporated herein by reference.

DESCRIPTION OF THE RELATED ART

1. Field of the Invention

The present invention relates to a stacked semiconductor device.

2. Description of the Related Art

In order to realize the downsizing, higher density packaging, and the like of a semiconductor device, a stacked multichip package which is formed of a plurality of stacked semiconductor elements sealed in one package has been in practical use. In the stacked multichip package, the plural semiconductor elements are stacked in sequence on a circuit base via an adhesive layer. Electrode pads of each of the semiconductor elements are electrically connected to connection parts of the circuit base via bonding wires. Such a stack is packaged by sealing resin, whereby the stacked multichip package is structured.

In a case where semiconductor elements equal in shape are stacked or semiconductor elements with an upper one being larger than a lower one are stacked in a stacked multichip package, there is a possibility that bonding wire of the lower semiconductor element comes into contact with the upper semiconductor element. Therefore, it is important to prevent occurrence of an insulation failure and a short circuit ascribable to the contact of the bonding wire. One method which has been adopted to prevent the contact with the upper semiconductor element is to increase the thickness of an adhesive layer for bonding the semiconductor elements, to, for example, 50 µm to 150 µm and insert bonding wire of the lower semiconductor element into the adhesive layer (see, JP-A 2001-308262 (KOKAI), JP-A 2002-222913 (KOKAI), and JP-A 2004-072009 (KOKAI)).

A resin material forming the adhesive layer is larger in coefficient of linear expansion than a Si wafer generally forming a semiconductor element. Therefore, when thermal cycle is applied to a stacked semiconductor device such as a stacked multichip package, a thermal stress (residual tensile stress) caused by a difference in coefficient of linear expansion between the adhesive layer and the semiconductor elements acts on the semiconductor elements. This thermal stress will be a factor to cause a crack in the semiconductor elements. In particular, in a stacked semiconductor device using a thick adhesive layer provided with a spacer function, at the time of a thermal cycle test for reliability evaluation, the stress concentrates on surfaces of end portions of the semiconductor elements, and a crack easily occurs due to the stress concentration.

SUMMARY OF THE INVENTION

A stacked semiconductor device according to an aspect of the present invention includes: a circuit base having an element mounting part; a first semiconductor element bonded on the element mounting part of the circuit base; and a second semiconductor element bonded on the first semiconductor element via an adhesive layer with a thickness of 50 µm or more, wherein the adhesive layer is formed of an insulating resin layer whose glass transition temperature is 135° C. or higher and whose coefficient of linear expansion at a temperature equal to or lower than the glass transition temperature is 100 ppm or less.

A stacked semiconductor device according to another aspect of the present invention includes: a circuit base having an element mounting part and a connection part; a first semiconductor element bonded on the element mounting part of the circuit base and having an electrode part; a second semiconductor element bonded on the first semiconductor element via an adhesive layer with a thickness of 50 µm or more and having an electrode part; a first bonding wire which electrically connects the connection part of the circuit base and the electrode part of the first semiconductor element to each other and whose end portion connected to the first semiconductor element is buried in the adhesive layer; and a second bonding wire electrically connecting the connection part of the circuit base and the electrode part of the second semiconductor element to each other, wherein the adhesive layer is formed of an insulating resin layer whose glass transition temperature is 135° C. or higher and whose coefficient of linear expansion at a temperature equal to or lower than the glass transition temperature is 100 ppm or less.

DETAILED DESCRIPTION OF THE INVENTION

Figure 1:
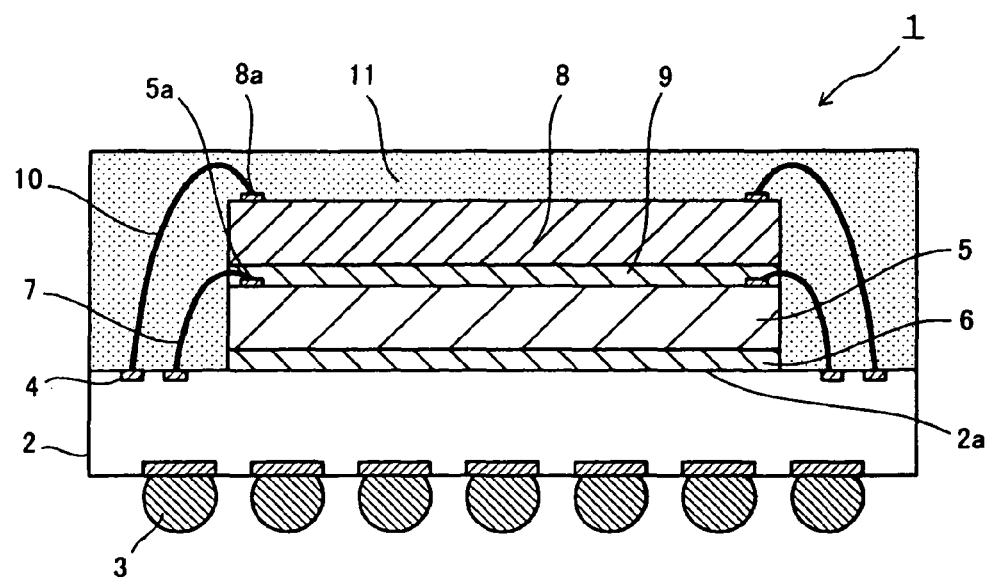
FIG. 1 is a cross-sectional view showing the structure of a stacked semiconductor device according to an embodiment of the present invention.

Hereinafter, an embodiment of the present invention will be described. FIG. 1 is a cross-sectional view showing the structure of a stacked semiconductor device with a stacked multichip structure according to the embodiment of the present invention. A stacked semiconductor device 1 shown in FIG. 1 has a circuit base 2 for mounting an element. The circuit base 2 may be any, providing that it has a semiconductor element mounting part and a circuit part. As the circuit base 2, usable is a wiring board formed of an insulating substrate or a semiconductor substrate on whose surface or in which a wiring network is formed as a circuit part, a board such as a lead frame in which an element mounting part and a circuit part are integrated, or the like.

The stacked semiconductor device 1 shown in FIG. 1 has a wiring board 2 as the circuit base for mounting the element. As a substrate constituting the wiring board 1, usable is any of substrates made of various materials, for example, a resin substrate, a ceramic substrate, an insulating substrate such as a glass substrate, a semiconductor substrate, or the like. An example of the wiring board using the resin substrate is a typical multilayer copper-clad laminated board (multilayer printed wiring board) or the like. On an underside of the wiring board 2, external connection terminals 3 such as solder bumps are provided.

On an upper surface side of the wiring board 2, an element mounting part 2a is provided. Around the element mounting part 2a, connection pads 4 electrically connected to the external connection terminals 3 via a wiring network (not shown) are provided. The connection pads 4 function as connection parts and also serve as wire bonding parts. A first semiconductor element 5 is bonded on the element mounting part 2a of the wiring board 2 via a first adhesive layer 6. A typical die attach material is used as the first adhesive layer 6. First electrode pads (electrode parts) 5a provided on an upper surface of the first semiconductor element 5 are electrically connected to the connection pads 4 of the wiring board 2 via first bonding wires 7.

A second semiconductor element 8 is bonded on the first semiconductor element 5 via a second adhesive layer 9. The second semiconductor element 8 has, for example, substantially the same shape as or a shape larger than the first semiconductor element 5. The second adhesive layer 9 at least partly softens or melts at a heating temperature for bonding the second semiconductor element 8 (die bonding temperature) to bond the first semiconductor element 5 and the second semiconductor element 8 to each other, while having end portions of the first bonding wires 7 connected to the first semiconductor element 5 (element-side end portions) inserted therein. Therefore, as the second adhesive layer 9, an insulative adhesive is used for ensuring insulation of the first bonding wires 7.

The element-side end portions of the first bonding wires 7 are buried in the second adhesive layer 9 so as to be prevented from coming into contact with the second semiconductor element 8. In the stacked semiconductor device 1 shown in FIG. 1, the first bonding wires 7 are apart from a lower surface of the second semiconductor element 8 due to a thickness of the second adhesive layer 9. This prevents occurrence of an insulation failure and a short circuit ascribable to the contact between the first bonding wires 7 and the second semiconductor element 8. The second adhesive layer also has a function as a spacer, and is formed of an insulating resin layer with a thickness of 50 μm or more so as to have the function as the spacer.

If the thickness of the insulating resin layer forming the second adhesive layer 9 is less than 50 μm, the first bonding wires 7 easily come into contact with the second semiconductor element 8, which easily causes the occurrence of insulation failure and short circuit. More preferably, the thickness of the second adhesive layer 9 is 70 μm or more, though depending on the diameter and the like of the bonding wires 7. Concrete examples of the thickness of the second adhesive layer 9 in a case where the diameter of the bonding wires 7 is 25 μm are 75 μm or 85 μm. The second adhesive layer 9, if too thick, would be an obstacle to the thinning of the stacked semiconductor device 1, and therefore, is preferably 150 μm or less in thickness.

To insert the element-side end portions of the first bonding wires 7 in the second adhesive layer 9 in a good condition at the time of the die bonding, the viscosity of the second adhesive layer 9 at the die bonding temperature (die bonding viscosity) is preferably not lower than 1 kPa·s and lower than 100 kPa·s. If the die bonding viscosity of the second adhesive layer 9 is less than 1 kPa·s, the adhesive is likely to spread out from an element end portion. If the die bonding viscosity of the second adhesive layer 9 is 100 kPa·s or more, the first bonding wires 7 are likely to suffer deformation or poor connection. The die bonding viscosity of the second adhesive layer 9 is preferably within a range from 1 kPa·s to 50 kPa·s, and more desirably, within a range from 1 kPa·s to 20 kPa·s.

Figure 2:
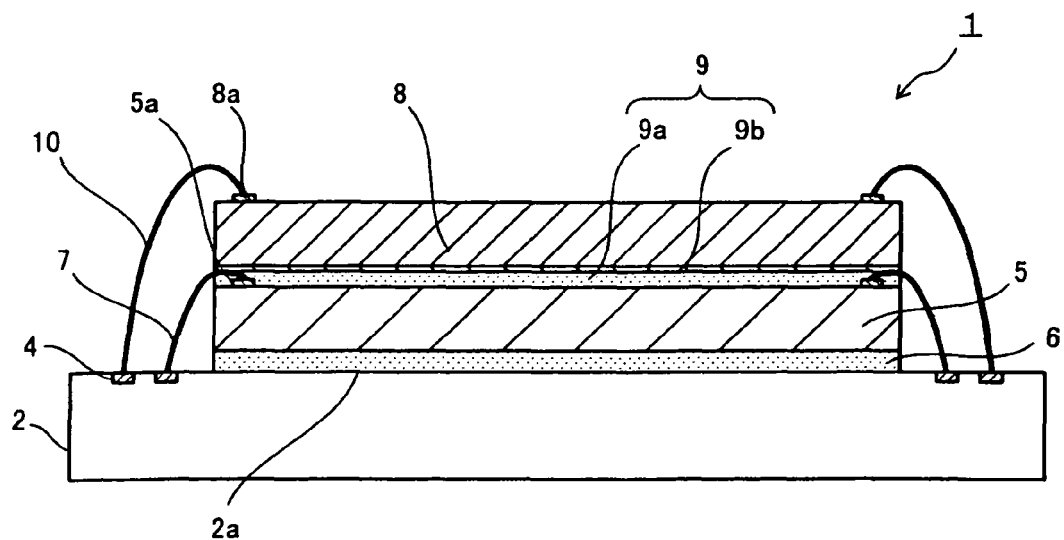
FIG. 2 is a cross-sectional view showing a modified example of the stacked semiconductor device shown in FIG. 1.

In FIG. 1, the prevention of the contact between the first bonding wires 7 and the second semiconductor element 8 relies on the thickness of the second adhesive layer 9. In addition, as shown in FIG. 2, the second adhesive layer 9 may be composed of a first resin layer 9a and a second resin layer 9b which are stacked, the first resin layer 9 softening or melting at a temperature for bonding the second semiconductor element 8 and the second resin layer 9b maintaining a layered form at the temperature for bonding the second semiconductor element 8. The first resin layer 9a is formed on the first semiconductor element 5 side and functions as an adhesive layer for the second semiconductor element 8. The second resin layer 9b is formed on the second semiconductor element 8 side and functions as an insulating layer which prevents the contact between the first bonding wires 7 and the second semiconductor element 8.

The element-side end portions of the first bonding wires 7 are buried in the first resin layer 9a. Since the second resin layer (insulating layer) 9b which maintains the layered form at the temperature for bonding the second semiconductor element 8 is formed on the second semiconductor element 8 side, it is possible to more surely prevent the occurrence of insulation failure and short circuit ascribable to the contact between the first bonding wires 7 and the second semiconductor element 8. The good bonding itself of the first semiconductor element 5 and the second semiconductor element 8 can be realized by the first resin layer 9a. To form the adhesive layer 9 with a two-layered structure, for example, resin sheets different in die bonding viscosity are stacked or resin compositions are applied in sequence.

In the adhesive layer 9 with the two-layered structure, the die bonding viscosity of the second resin layer 9b is preferably 100 kPa·s or more. The second resin layer 9b with the die bonding viscosity of less than 100 kPa·s cannot fully exhibit the function of preventing the contact of the first bonding wires 7. More preferably, the die bonding viscosity of the second resin layer 9b is 200 kPa·s or higher. However, too high a viscosity would impair the function as the adhesive layer, and therefore, the die bonding viscosity of the second resin layer (insulating layer) 9b is preferably lower than 1000 kPa·s. The die bonding viscosity of the first resin layer (adhesive layer) 9a is preferably not lower than 1 kPa·s and lower than 100 kPa·s.

To keep the first semiconductor element 5 and the second semiconductor element 8 apart from each other, a stud bump made of a metal material or a resin material may be formed on an electrode pad, of the first semiconductor element 5, which is not used for the connection (non-connection pad). Such a structure can also effectively prevent the contact between the first bonding wires 7 and the second semiconductor element 8. The height of the stud bump is set so that the stud bump becomes higher than the first bonding wires 7. The function of the stud bump as a spacer prevents the contact between the second semiconductor element 8 and the first bonding wires 7. The stud bump may be provided only at one place but is preferably provided at three places or more on a line passing through the gravity center of the first semiconductor element 5.

The second semiconductor element 8 bonded on the first semiconductor element 5 via the second adhesive layer 9 has second electrode pads (electrode parts) 8a. The second electrode pads 8a are electrically connected to the connection pads 4 of the wiring board 2 via second bonding wires 10. The first and second semiconductor elements 5, 8 stacked on the wiring board 2 are sealed by sealing resin 11 such as, for example, epoxy resin. These constituent elements constitute the stacked semiconductor device 1 with a stacked multichip package structure.

In FIG. 1 and FIG. 2, the structure in which the two semiconductor elements 5, 8 are stacked is described, but the number of stacked semiconductor elements is not limited to this. The number of stacked semiconductor elements may be three or more. Further, the form of the stacked semiconductor device is not limited to the stacked multichip package as described above, but may be a semiconductor package (TSOP or the like) using a lead frame as the circuit base 2 for mounting the element.

The second adhesive layer 9 (the layers 9a, 9b in the case of the two-layered structure) is formed of an insulating resin layer whose glass transition temperature is 135° C. or higher and whose coefficient of linear expansion at a temperature in a range equal to or lower than the glass transition temperature is 100 ppm or less. The glass transition temperature and the coefficient of linear expansion of the second adhesive layer 9 represent characteristics which are obtained after the first semiconductor element 5 and the second semiconductor element 8 are bonded together. A polymeric material such as insulating resin forming the second adhesive layer 9 is generally in a glass format low temperatures, and at temperatures higher than the glass transition temperature (glass transition point Tg), it turns into a rubber form (further, a liquid form) and exhibits a sharp increase in coefficient of linear expansion.

The second adhesive layer 9, if formed of an insulating resin layer whose glass transition temperature is equal to or lower than a temperature applied at the time of a thermal cycle test, would exhibit a sharp increase in its coefficient of linear expansion at the time of the thermal cycle test. This further increases a difference in coefficient of linear expansion between the second adhesive layer 9 and the semiconductor elements 5, 8. The increase in the difference in coefficient of linear expansion between the second adhesive layer 9 and the semiconductor elements 5, 8 accordingly increases a thermal stress (tensile stress) acting on the semiconductor elements 5, 8.

Since the thermal stress (tensile stress) concentrates on a surface of an end portion of the first semiconductor element 5, the first semiconductor element 5 easily suffers crack and breakage due to this stress concentration. A temperature range of the thermal cycle test of a semiconductor device is generally from −55° C. to 125° C. Therefore, by setting the glass transition temperature of the insulating resin layer forming the second adhesive layer 9 to a temperature equal to or higher than the sum (135° of a higher-side temperature (125° C.) of the thermal cycle test, which causes the tensile stress acting on the semiconductor elements 5, 8, and a thermal margin (+10° C.), it is possible to reduce the increase of the difference in coefficient of linear expansion between the second adhesive layer 9 and the semiconductor elements 5, 8 at the time of the thermal cycle test.

The tensile stress acting on the semiconductor elements 5, 8 at time of the thermal cycle test also depends on a value of the coefficient of linear expansion that the insulating resin layer forming the second adhesive layer 9 has at a temperature equal to or lower than the glass transition temperature. That is, if the insulating resin layer, even with the glass transition temperature of 135° or higher, has a coefficient of linear expansion whose value itself at a temperature equal to or higher than the glass transition temperature is large, the tensile stress acting on the semiconductor elements 5, 8 increases. Accordingly, the semiconductor elements 5, 8 easily suffer a crack and the like.

Figure 3:
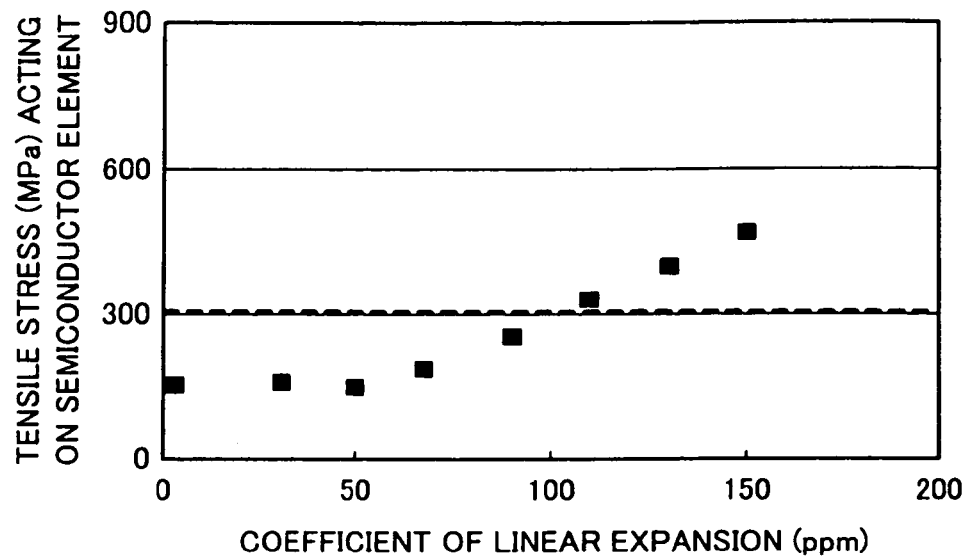
FIG. 3 is a graph showing an example of an influence that a coefficient of linear expansion of a second adhesive layer in the stacked semiconductor device has on a value of a surface tensile stress of a semiconductor element at the time of a thermal cycle test.

Therefore, the second adhesive layer 9 is formed of the insulating resin layer whose coefficient of linear expansion at a temperature equal to or lower than the glass transition temperature is 100 ppm or less. FIG. 3 shows an example of the correlation between the coefficient of linear expansion of an insulating resin layer at a temperature equal to or lower than the glass transition temperature and a tensile stress acting on a semiconductor element (Si chip) at the time of a thermal cycle test (−55° C. to 125° C.). As is apparent from FIG. 3, the tensile stress acting on the semiconductor element increases in accordance with the accession in the coefficient of linear expansion of the insulating resin layer. Generally, when the tensile stress acting on a semiconductor element exceeds 300 MPa, a crack easily occurs.

As is apparent from FIG. 3, by setting the coefficient of linear expansion of the insulating resin layer forming the second adhesive layer 9 to 100 ppm or less, it is possible to reduce a crack occurring in the semiconductor elements 5, 8 at the time of the thermal cycle test. The tensile stress acting on the semiconductor elements 5, 8 also varies depending on the thickness thereof, and the thinner the semiconductor elements 5, 8 are, the larger the tensile stress is. For example, in a case where the semiconductor elements 5, 8 with a thickness of 70 μm or less are used, the insulating resin layer forming the second adhesive layer 9 more preferably has a 70 ppm or less of coefficient of linear expansion at a temperature equal to or lower than the glass transition temperature.

Figure 4:
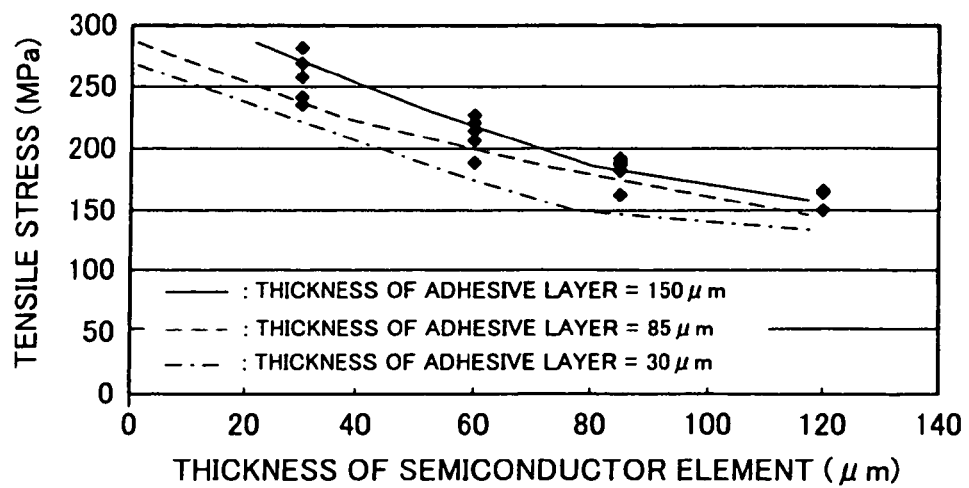
FIG. 4 is a graph showing an example of an influence that a thickness of the second adhesive layer and a thickness of the semiconductor element in the stacked semiconductor device have on a value of a surface tensile stress of the semiconductor element at the time of a thermal cycle test.

FIG. 4 shows results of the measurement of an influence that the thickness of a semiconductor element and the thickness of an adhesive layer have on a value of a surface tensile stress of a semiconductor element (Si chip) at the time of a thermal cycle test (−55° C. to 125° C.). As is apparent from FIG. 4, the thicker the adhesive layer (insulating resin layer) 9 is, the larger the value of the surface tensile stress of the semiconductor elements 5, 8 is. Further, the thinner the semiconductor elements 5, 8 are, the larger the value of the surface tensile stress is. Therefore, in a case where the stacked semiconductor device 1 is formed of the semiconductor elements 5, 8 whose thickness is as small as 70 μm or less, the coefficient of linear expansion of the insulating resin layer is more preferably 70 ppm or lower.

As described above, in forming the second adhesive layer 9, the use of the insulating resin layer whose glass transition temperature is 135° C. or higher and whose coefficient of linear expansion at a temperature equal to or lower than the glass transition temperature is 100 ppm or less, more preferably 70 ppm or less makes it possible to reduce the difference in coefficient of linear expansion between the second adhesive layer 9 and the semiconductor elements 5, 8 at the time of the thermal cycle test. This enables a reduction in the thermal stress (tensile stress) acting on the semiconductor elements 5, 8 at the time of the thermal cycle test.

The reduction in the thermal stress (tensile stress) acting on the semiconductor elements 5, 8 based on the second adhesive layer 9 makes it possible to reduce a crack, breakage, and the like occurring in the semiconductor elements 5, 8 at the time of the thermal cycle test. That is, reliability of the stacked semiconductor device 1 against the thermal cycle test can be enhanced. The effect of improving reliability against the thermal cycle is especially effective in a case where the semiconductor elements 5, 8 with a thickness of 70 μm or less are used.

The insulating resin layer forming the second adhesive layer 9 is preferably made of thermosetting resin such as, for example, epoxy resin, silicone resin, polyimide resin, acrylic resin, bismaleimide resin, or the like. In adopting the thermosetting insulating resin, it is possible to adjust the glass transition temperature of the second adhesive layer (insulating resin layer) 9 based on a molecular weight, a degree of polymerization, and a cross linkage degree of a main chain, kind and amount of a substituent of a side chain, kind and amount of an additive (for example, plasticizer) in a resin composition, kinds and amounts of a curing agent and an cross linking agent, and the like. Further, by adjusting the content of an inorganic filler such as silica in the insulating resin composition, it is possible to control the coefficient of linear expansion of the insulating resin layer.

Thus, the second adhesive layer 9 bonding the semiconductor elements 5, 8 is formed of the insulating resin layer whose glass transition temperature is adjusted to 135° C. or higher and whose coefficient of liner expansion at a temperature equal to or lower than the glass transition temperature is adjusted to 100 ppm or less (more preferably, 70 ppm or less), based on the kind, structure, polymerization condition of the thermosetting insulating resin, the kind and amount of the additive, and so on. In a case where the adhesive layer with the two-layered structure is used as the second adhesive layer 9, the first and second resin layers 9a, 9b satisfying the above conditions are used.

To form the second adhesive layer 9, for example, an adhesive sheet is pasted on or an adhesive resin composition (coating resin composition) is applied on a rear surface of a semiconductor wafer, and thereafter, the adhesive sheet or the adhesive resin composition is cut together with the semiconductor wafer. An adhesive sheet in an individual piece form may be supplied between the first semiconductor element 5 and the second semiconductor element 8 to function as the second adhesive layer 9. A supply method of the second adhesive layer 9 is not limited to a specific one.

A modulus of elasticity (room temperature modulus of elasticity) of the second adhesive layer 9 is preferably not lower than 500 MPa nor higher than 2 GPa. If the modulus of elasticity of the second adhesive layer 9 after it is cured (cured resin layer) is lower than 500 MPa, the second semiconductor element 8 greatly bends in a wire bonding step, so that the second semiconductor element 8 easily suffers cracks. If the modulus of elasticity of the second adhesive layer 9 after it is cured exceeds 2 GPa, manufacturing performance of the second semiconductor element 8 and the stacked semiconductor device 1 is likely to be lowered. The modulus of elasticity of the cured second adhesive layer 9 within such a range does not affect the value of the surface tensile stress of the semiconductor elements 5, 8 at the time of the thermal cycle test.

The stacked semiconductor device 1 of this embodiment is fabricated in the following manner, for instance. First, the first semiconductor element 5 is bonded on the wiring board 2 by using the first adhesive layer 6. Subsequently, through the wire bonding step, the connection pads 4 of the wiring board 2 and the electrode pads 5a of the first semiconductor element 5 are electrically connected by the first bonding wires 7. Next, the second semiconductor element 8 is bonded on the first semiconductor element 5 by using the second adhesive layer 9.

Before the die bonding step of the second semiconductor element 8, the second adhesive layer 9 is formed in advance on the rear surface of the semiconductor wafer not yet cut into the second semiconductor elements 8, as a pasted layer of the adhesive sheet or as a coating layer of the adhesive resin composition, for instance. This layer together with the semiconductor wafer is cut into individual pieces (dicing), whereby the second semiconductor elements 8 each having the second adhesive layer 9 is formed. The second adhesive layer 9 as an adhesive sheet in an individual piece form may be bonded on the rear surface of the second semiconductor element 8 or may be supplied between the first semiconductor element 5 and the second semiconductor element 8.

Next, the second semiconductor element 8 in an individual piece form is held by a die bonding tool to be aligned with the first semiconductor element 5 placed on a die bonding stage. The second semiconductor element 8 is moved down to be pressed onto the first semiconductor element 5. The second adhesive layer 9 is heated by using at least one of the die bonding stage and the die bonding tool. While at least part of the second adhesive layer 9 is softened or melted by the heat from the die bonding stage or the die bonding tool, the second semiconductor element 8 is pressed onto the first semiconductor element 5. Thereafter, the second adhesive layer 9 is thermally cured by being further heated.

The second adhesive layer 9 has a thickness large enough to have the element-side end portions of the first bonding wires 7 inserted therein, and thus can prevent the contact between the first bonding wires 7 and the second semiconductor element 8. Thereafter, through the wire bonding step of the second semiconductor element 8, the connection pads 4 of the wiring board 2 and the electrode pads 8a of the second semiconductor element 8 are electrically connected by the second bonding wires 10. Further, the first and second semiconductor elements 5, 8 together with the bonding wires 7, 10 and so on are sealed by the sealing resin 11, whereby the stacked semiconductor device 1 shown in FIG. 1 or FIG. 2 is fabricated.

As concrete examples of the above-described embodiment, 100 stacked semiconductor devices (example) were fabricated in each of which semiconductor elements 5, 8 each having a 60 μm thickness are bonded together via an epoxy resin adhesive. The epoxy resin adhesive is made of an epoxy resin composition which contains 40 mass % of epoxy resin, 10 mass % of hardener (phenol resin), 5 mass % of hardening accelerator, and 45 mass % of silica. As for characteristics of the epoxy resin adhesive after bonding and curing, a glass transition temperature is 155° C. and a coefficient of linear expansion at a temperature equal to or lower than the glass transition temperature is 70 ppm. The thickness of the adhesive layer made of the epoxy resin adhesive is 85 μm.

As a comparative example of the present invention, 100 stacked semiconductor devices were fabricated in the same manner as in the example except in that a used epoxy resin adhesive is made of an epoxy resin composition containing 50 mass % of epoxy resin, 5 mass % of hardener (phenol resin), 5 mass % of hardening accelerator, and 40 mass % of silica. As for characteristics of the epoxy resin adhesive used in the comparative example after bonding and curing, a glass transition temperature is 155° C. and a coefficient of linear expansion at a temperature equal to or lower than the glass transition temperature is 120 ppm.

Figure 5:
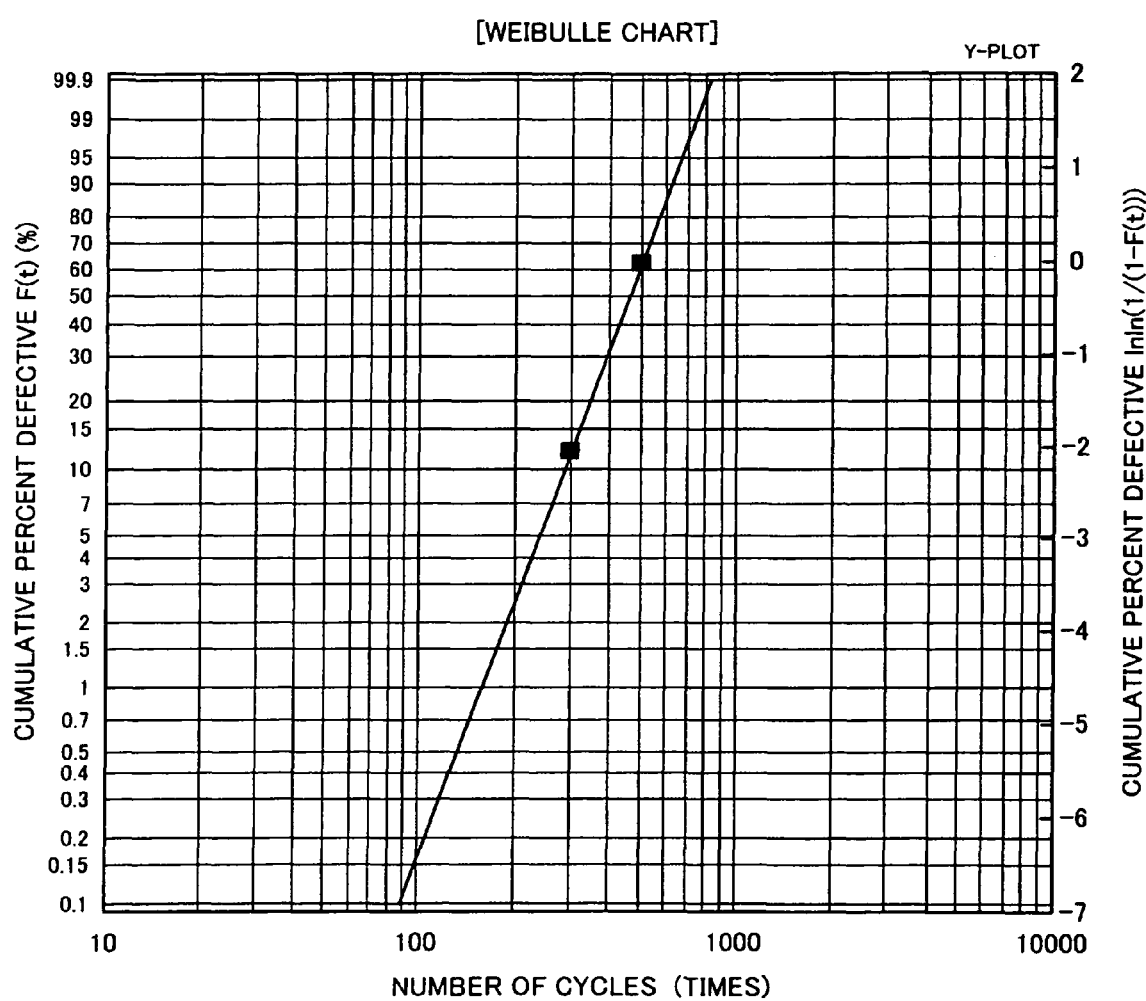
FIG. 5 is a chart showing a percent defective (cumulative percent defective) in a thermal cycle test of a stacked semiconductor device according to a comparative example.

A thermal cycle test with −55° C.×20 min→room temperature (25° C.)×20 min→125° C.×20 min being one cycle is conducted on the 100 stacked semiconductor devices according to the example and those of the comparative example. As a result, an incidence of cracks after 500 cycles was 0% in the stacked semiconductor devices of the example. On the other hand, in the stacked semiconductor devices of the comparative example, an incidence of cracks after 500 cycles was increased to 55%. FIG. 5 shows a Weibull chart of a cumulative percent defective in the thermal cycle test (TCT) of the stacked semiconductor devices of the comparative example.

It is seen that the stacked semiconductor device 1 according to the embodiment is excellent in reliability against the thermal cycle test.

In the above-described embodiment, the wire bonding connection is adopted for the connection of the semiconductor elements, but the connection form is not limited to this. The connection of the semiconductor elements may be flip-chip connection. A stacked semiconductor device whose insulating resin layer insulating the periphery of a flip-chip connection part has a large thickness of 50 µm or more can also provide the effect of reducing a crack ascribable to a difference in coefficient of linear expansion between semiconductor elements and the insulating resin layer. Further, owing to the crack reducing effect, reliability of the stacked semiconductor device can be enhanced.

It should be noted that the present invention is not limited to the above-described embodiment, and is applicable to various kinds of stacked semiconductor devices in which a plurality of semiconductor elements are bonded by using an adhesive layer with a thickness of 50 µm or more. Such stacked semiconductor devices are also included in the present invention. Further, the embodiment of the present invention can be extended or modified within a range of the technical spirit of the present invention, and the extended and modified embodiments are also included in the technical scope of the present invention.

What is claimed is:

1. A method of manufacturing a stacked semiconductor device, comprising:
preparing a circuit base having an element mounting part and a connection part;
bonding a first semiconductor element on the element mounting part of the circuit base, the first semiconductor element having an upper face and an electrode pad formed on the upper face;
electrically connecting the electrode pad to the connection part with a bonding wire;
bonding a second semiconductor element on the upper face of the first semiconductor element via an adhesive layer with a thickness of 50 µm or more while burying an end of the bonding wire connected to the electrode pad in the adhesive layer; and
sealing the first and second semiconductor elements together with the bonding wire by a sealing resin to obtain the stacked semiconductor device,
wherein the adhesive layer is formed of an insulating resin layer whose glass transition temperature is 135° C. or higher and whose coefficient of linear expansion at a temperature equal to or lower than the glass transition temperature is 100 ppm or less and greater than zero ppm, so that a tensile stress acting on the first or second semiconductor element due to the adhesive layer during a thermal cycle test of the stacked semiconductor device is controlled to 300 MPa or less and greater than zero MPa.

2. The manufacturing method as set forth in claim 1, wherein the adhesive layer has the thickness within a range from 70 µm to 150 µm.

3. The manufacturing method as set forth in claim 1, wherein each of the first and second semiconductor elements has a thickness of 70 µm or less.

4. The manufacturing method as set forth in claim 3, wherein the insulating resin layer has the coefficient of linear expansion of 70 ppm or lower at the temperature equal to or lower than the glass transition temperature.

5. The manufacturing method as set forth in claim 1, wherein the bonding wire is apart from a lower surface of the second semiconductor element due to the thickness of the adhesive layer.

6. The manufacturing method as set forth in claim 1, wherein the adhesive layer has a die bonding viscosity of not lower than 1 kPa·s and lower than 100 kPa·s.

7. The manufacturing method as set forth in claim 1, wherein the adhesive layer includes:
a first resin layer disposed on the first semiconductor element side and softening or melting at a temperature for bonding the second semiconductor element; and
a second resin layer disposed on the second semiconductor element side and maintaining a layered form at the temperature for bonding the second semiconductor element,
wherein the end portion of the bonding wire is buried in the first resin layer.

8. The manufacturing method as set forth in claim 7, wherein the first resin layer has a die bonding viscosity of not lower than 1 kPa·s and lower than 100 kPa·s, and
wherein the second resin layer has a die bonding viscosity of 100 kPa·s or higher.

9. The manufacturing method as set forth in claim 1, wherein the thermal cycle test is carried from −55° C. to 125° C.

10. A method of manufacturing a stacked semiconductor device, comprising:
preparing a circuit base having an element mounting part and a connection part;
bonding a first semiconductor element on the element mounting part of the circuit base, the first semiconductor element having an upper face and an electrode pad formed on the upper face;
electrically connecting the electrode pad to the connection part with a bonding wire;
adjusting glass transition temperature and coefficient of linear expansion of a thermosetting resin as an adhesive so that the glass transition temperature of the thermosetting resin after curing is 135° C. or higher and the coefficient of linear expansion of the thermosetting resin after curing at a temperature equal to or lower than the glass transition temperature is 100 ppm or less;
stacking a second semiconductor element on the upper face of the first semiconductor element via an adhesive layer made of the thermosetting resin while burying an end of the bonding wire connected to the electrode pad in the adhesive layer;
curing the thermosetting resin to bond the second semiconductor element on the upper face of the first semiconductor element via the adhesive layer made of the cured thermosetting resin with a thickness of 50 µm or more; and
sealing the first and second semiconductor elements together with the bonding wire by a sealing resin to obtain the stacked semiconductor device,
wherein a tensile stress acting on the first or second semiconductor element due to the adhesive layer during a thermal cycle test of the stacked semiconductor device is controlled to 300 MPa or less and greater than zero MPa.

11. The manufacturing method as set forth in claim 10, wherein the adhesive layer has the thickness within a range from 70 µm to 150 µm.

12. The manufacturing method as set forth in claim 10, wherein each of the first and second semiconductor elements has a thickness of 70 µm or less.

13. The manufacturing method as set forth in claim 12, wherein the insulating resin layer has the coefficient of linear expansion of 70 ppm or lower at the temperature equal to or lower than the glass transition temperature.

14. The manufacturing method as set forth in claim 10, wherein the bonding wire is apart from a lower surface of the second semiconductor element due to the thickness of the adhesive layer.

15. The manufacturing method as set forth in claim 10, wherein the adhesive layer has a die bonding viscosity of not lower than 1 kPa·s and lower than 100 kPa·s.

16. The manufacturing method as set forth in claim 10, wherein the adhesive layer includes:
a first resin layer disposed on the first semiconductor element side and softening or melting at a temperature for bonding the second semiconductor element; and
a second resin layer disposed on the second semiconductor element side and maintaining a layered form at the temperature for bonding the second semiconductor element, wherein the end portion of the bonding wire is buried in the first resin layer.

17. The manufacturing method as set forth in claim 16, wherein the first resin layer has a die bonding viscosity of not lower than 1 kPa·s and lower than 100 kPa·s, and wherein the second resin layer has a die bonding viscosity of 100 kPa·s or higher.

18. The manufacturing method as set forth in claim 10, wherein the thermal cycle test is carried from −55° C. to 125° C.

* * * * *